United States Patent
Hettler (10) Patent No.: US 11,515,221 B2
(45) Date of Patent: Nov. 29, 2022

(54) HOUSING FOR AN OPTOELECTRONIC DEVICE, AND METHOD FOR PRODUCING SAME, AND LID FOR A HOUSING

(71) Applicant: Schott AG, Mainz (DE)

(72) Inventor: Robert Hettler, Kumhausen (DE)

(73) Assignee: Schott AG, Mainz (DE)

( * ) Notice: Subject to any disclaimer, the term of this patent is extended or adjusted under 35 U.S.C. 154(b) by 467 days.

(21) Appl. No.: 16/001,323

(22) Filed: Jun. 6, 2018

(65) Prior Publication Data

US 2018/0350704 A1    Dec. 6, 2018

(30) Foreign Application Priority Data

Jun. 6, 2017 (DE) ................... 10 2017 112 430.6

(51) Int. Cl.

| | |
|---|---|
| H01L 23/08 | (2006.01) |
| H01L 31/0203 | (2014.01) |
| H01L 21/48 | (2006.01) |
| H01L 33/48 | (2010.01) |
| H01L 31/0232 | (2014.01) |
| H01L 25/16 | (2006.01) |
| H01L 31/167 | (2006.01) |
| H01L 23/10 | (2006.01) |
| H01L 33/58 | (2010.01) |

(52) U.S. Cl.
CPC .......... *H01L 23/08* (2013.01); *H01L 21/4803* (2013.01); *H01L 23/10* (2013.01); *H01L 25/167* (2013.01); *H01L 31/0203* (2013.01); *H01L 31/02325* (2013.01); *H01L 31/02327* (2013.01); *H01L 33/483* (2013.01); *H01L 31/167* (2013.01); *H01L 33/58* (2013.01)

(58) Field of Classification Search
CPC ..... H01L 23/08; H01L 23/10; H01L 21/4803; H01L 25/167; H01L 31/02327; H01L 31/0203; H01L 31/167; H01L 31/02325; H01L 33/483; H01L 33/58
See application file for complete search history.

(56) References Cited

U.S. PATENT DOCUMENTS

| | | | |
|---|---|---|---|
| 4,314,225 A | 2/1982 | Tominaga et al. | |
| 6,136,128 A * | 10/2000 | Chung ................ | B29C 66/114 156/235 |
| 6,150,197 A * | 11/2000 | Boles ................ | H01L 21/28525 257/E21.166 |
| 9,199,876 B2 | 12/2015 | Wang et al. | |
| 9,409,811 B2 | 8/2016 | Rindt et al. | |
| 9,564,569 B1 | 2/2017 | Wang et al. | |
| 2002/0062663 A1* | 5/2002 | Jaeger ................ | C25D 5/022 65/60.4 |
| 2005/0158889 A1* | 7/2005 | Brouillette ......... | H01L 22/26 438/16 |

(Continued)

OTHER PUBLICATIONS

Glass 8347. Technical Data, p. 1, 2017.*

(Continued)

*Primary Examiner* — Galina G Yushina
(74) *Attorney, Agent, or Firm* — Taylor IP, P.C.

(57) ABSTRACT

The invention relates to a housing for an optoelectronic device and to a method for producing such a housing. For producing a lid for the housing, an infrared-transparent material is used, into which at least one glass window is integrated.

11 Claims, 7 Drawing Sheets

(56) References Cited

U.S. PATENT DOCUMENTS

| | | | |
|---|---|---|---|
| 2010/0181484 A1* | 7/2010 | Inada | G02B 5/1876 |
| | | | 250/332 |
| 2011/0181939 A1* | 7/2011 | Bressand | B32B 17/10036 |
| | | | 359/270 |
| 2012/0061573 A1* | 3/2012 | Harchanko | G01J 5/0018 |
| | | | 250/339.15 |
| 2014/0231635 A1 | 8/2014 | Kerness et al. | |
| 2016/0176133 A1* | 6/2016 | Liu | B29C 33/38 |
| | | | 264/1.38 |
| 2016/0240721 A1* | 8/2016 | Chu | H01L 25/167 |
| 2016/0307881 A1 | 10/2016 | Ho | |
| 2017/0272652 A1* | 9/2017 | Siminoff | G08B 3/10 |

OTHER PUBLICATIONS

NIST Special Publication 250-94, Infrared Optical Properties of Materials, pp. 44-45 (Year: 2015).*

"Transmission Spectrum of Lexan HSP6-1125 Polycarbonate", taken from https://www.gsoptics.com/transmission-curves/ (1 page).

Graph—Total Transmission of 5 mm Thick, Uncoated Si Window taken from www.thorlabs.com (1 page).

Graph—Sapphire taken from www.tempotec.com/products, choose Windows, IR Windows (1 page).

Graph—Aluminum Oxide (mid-IR) taken from Lisa.chem.ut.ee (1 page).

Graph—Germanium with AR.20 Coating (3-12um) taken from https://www.newport.com/f/germanium-parallel-windows (1 page).

* cited by examiner

Prior Art

HOUSING FOR AN OPTOELECTRONIC DEVICE, AND METHOD FOR PRODUCING SAME, AND LID FOR A HOUSING

BACKGROUND OF THE INVENTION

1. Field of the Invention

The invention relates to a housing and to a lid for a housing for electronic devices, in particular for optoelectronic devices.

Additionally, the invention relates to a method for producing a housing for electronic devices.

2. Description of the Related Art

Housings for optical devices, in particular for optoelectronic devices, are known. These are in particular hermetically sealed housings having windows through which electromagnetic radiation can enter into the housing or exit from the housing.

Such housings are especially known in the field of optical sensors. Existing windows are transparent in the UV range, and/or in the visible wavelength range, and/or in the infrared range.

Quartz glass lends itself as a versatile material for such a window. However, quartz glass exhibits very low thermal expansion and therefore it is difficult to connect it to most other materials used for such packages, e.g. to silicon.

U.S. Pat. No. 9,564,569 (Wang et al.) discloses a hermetically sealed housing in which a plurality of windows are separately applied to a base body. In this way, a housing can be provided which has a window that is transparent to infrared radiation as well as a window that is transparent in another range of wavelengths.

However, a disadvantage of this housing configuration is its complicated manufacture. For example, several handling steps are required to introduce the different windows. Furthermore, the housing base body must have a continuous central web in order to provide a circumferentially closed sealing edge for both windows.

What is needed in the art is a housing for an electronic device and a method for its production, which allow to provide, in a simple manner, a housing lid that has an area which is transparent to infrared radiation as well as an area which is transparent to a different wavelength.

SUMMARY OF THE INVENTION

The invention is achieved by use of a housing for at least one electronic device, a lid for the housing, and by a method for producing the housing for an electronic device.

One embodiment of the invention provides a housing for at least one electronic device. More particularly, the invention relates to a housing for an optoelectronic device.

In another embodiment the housing may be equipped with one or more optoelectronic devices. Sensors, including UV, IR, or photodetectors, and/or light-emitting diodes may be used.

In another embodiment, the invention provides a housing which includes a lid that is connected to a wafer which may be separated into individual housings and may include electronic devices.

In another embodiment of the invention, the housing includes a lid made of a material that is transparent to infrared radiation. The material preferably exhibits an average transmittance of more than 20%, and preferably more than 40% where the wavelength range is between 1.5 to 5 µm.

In another embodiment of the invention, the lid is made of silicon. Silicon is transparent above a wavelength of 1 m and can be well connected to other semiconductor components, in particular to a wafer which also consists of silicon.

In another embodiment of the invention the lid includes at least one glass window made of infrared radiation transparent material.

The invention in another form may provide a lid which hermetically closes the housing, constitutes the support for the frame of a glass window, preferably the glass window is transparent in a range of wavelengths different than the material of the lid.

In another embodiment of the invention, a housing providing for at least one electronic device, wherein the housing includes a base part with a mounting area for the electronic device, a lid made of glass, wherein the glass lid has at least one window integrated therein made of a material that is transparent to infrared radiation.

Hence, this embodiment of the invention takes the opposite way than the first embodiment of the invention, providing a lid made of glass in which a window is integrated that is made of material transparent to infrared radiation.

Below the glass window, or below a portion of the glass lid, the mounting area for an optoelectronic device can be provided, so that electromagnetic radiation entering through the window is incident thereon, and/or which emits electromagnetic radiation through the glass window.

In one embodiment of the invention, a mounting area for a optoelectronic device is located under the portion of the lid serving as a window for infrared radiation or under the window made of infrared radiation transparent material.

The invention in one form may provide, by a few process steps and in a simple manner, a hermetically sealed housing having a lid under which are provided both; a mounting area for an infrared radiation-sensitive optoelectronic device and a mounting area for an optoelectronic device intended for a different wavelength range.

The mounting areas may be spatially separated by a web or provided for in a single cavity of the housing over which the lid extends, where in the single cavity may include (not shown) a single sensor having two different detection ranges for different wavelengths extending over the two mounting areas.

The lid is preferably directly connected to a base part or lower part of the housing.

The glass window or the glass lid is in particular transparent to UV radiation and/or to visible light. The term 'transparent to UV radiation and/or visible light' is preferably understood to mean an average transmittance in the range of the UV radiation or in the range of visible light of on average more than 20%, preferably more than 40%.

Besides the use of silicon as the material of the lid, or for the window transparent to infrared radiation, another embodiment contemplates to use aluminum oxide, in particular sapphire, or germanium.

When silicon is used as the material for the lid, or as the material for the window that is made of material transparent to infrared radiation, the glass window or the glass lid, respectively, is preferably made of a glass having a coefficient of mean linear thermal expansion, at 20 to 300° C., between 2 and 5 ppm/K.

Preferably, the coefficient of linear thermal expansion is between 3 and 5 ppm/K, more preferably the coefficient of linear thermal expansion is less than 4 ppm/K.

In an embodiment including a glass lid or a glass window, the glass lid or the glass window is made of a borosilicate glass. This is particularly advantageous in an embodiment comprising a lid made of glass. In this case, the lid can be very easily connected to the base part and to the window made of infrared radiation transparent material by anionic bonding.

The lid preferably has a plate-like shape. According to an embodiment of the invention, the lid is hermetically sealed to a lower part to form a housing. The lower part preferably has recesses, each one providing a mounting area for at least one electronic device.

In another embodiment of the invention, a glass window has been fused into the lid. It is in particular suggested that, for providing the glass window, a glass insert is heated up to a temperature at least above the glass transition temperature $T_g$ so that the glass bonds to the material of the lid in this way.

The glass may have different coefficient of thermal expansion than the material of the lid, resulting in stress rising in the glass during cooling.

The resulting stress depends on; the temperature required for the fusing process, the coefficient of thermal expansion of the employed glass material and of the material of the lid, and on the size of the glass window.

During the cooling process, a difference in length between the glass window and the adjoining portion of the lid results, which leads to a compressive or tensile stress.

Assuming that the materials are firmly bonded together at approximately 20 K below the glass transition temperature, i.e. when the glass is no longer soft, the difference in length between the glass and the adjoining lid substrate, which results from the cooling can therefore be determined as follows:

$$\frac{\Delta L}{L} = (T_g - 20) * (CTE_{Si} - CTE_{glaze}),$$

where L is the length of the glass window in its main extension direction, and $\Delta L$ is the difference in length when heated during the integration of the glass window by fusing. In this example, $T_g$ is the glass transition temperature, $CTE_{Si}$ is the coefficient of mean linear thermal expansion of silicon, and $CTE_{glass}$ is the coefficient of mean linear thermal expansion of the glass.

The following applies approximately for the stress a in the glass:

$$\sigma_g = -E * \left(\frac{\Delta L}{L}\right)$$

where E is the modulus of elasticity, or Young's modulus, of the glass that is used.

Preferably, the glass and the material of the lid are matched to each other such that at 20° C. the glass window is under a stress ranging between −100 MPa of compressive stress and +30 MPa of tensile stress, preferably between −20 MPa of compressive stress and +10 MPa of tensile stress, wherein the stresses may be achieved by using glass with an expansion coefficient that has been adapted to that of the employed lid material.

In the case of glasses having a low glass transition temperature $T_g$, a greater difference in the coefficient of linear thermal expansion between the glass and the material of the lid is allowable to meet the range of tensile or compressive stresses stated above.

In one embodiment of the invention, glasses having a glass transition temperature $T_g$ of less than 600° C. can be used.

In one embodiment of the invention, glasses having a coefficient of mean thermal expansion a at 20 to 300° C. of 3 to 5 ppm/K and a glass transition temperature $T_g$ between 300° C. to 600° C. can be used.

In one embodiment of the invention, a glass can be used that has a coefficient of mean linear thermal expansion a at 20 to 300° C. of 3 to 4 ppm/K and a glass transition temperature $T_g$ of 500° C. to 600° C.

In one embodiment of the invention, a lower-melting glass with a glass transition temperature $T_g$ between 300 and 500° C. is used, which has a coefficient of mean linear thermal expansion a at 20 to 300° C. of 4 to 5 ppm/K.

The following commercially available glasses can be used: Schott 8689, Schott 8347, Schott 8330, Schott 8487, Schott 8341, Schott 8337, Schott G017-388, Schott G017-002, and Schott G017-339.

The invention furthermore relates to a lid for a housing for an electronic device. In particular, the invention relates to a lid for a housing as described above.

The lid consists of a material that is transparent to infrared radiation, and it has a glass window which is transparent at least to one other wavelength range of electromagnetic radiation, or, according to the second embodiment of the invention, the lid consists of glass and comprises a window made of a material that is transparent to infrared radiation.

The lid, or the window made of infrared radiation transparent material, respectively, may be made of silicon and includes a glass that has been fused, bonded, or welded thereto.

The invention furthermore relates to a method for producing a housing for an electronic device, in particular a housing as described above.

According to the invention, a lid is provided that is made of a material transparent to infrared radiation, in particular silicon, and a glass window is integrated into the lid, or a window made of infrared radiation transparent material is integrated into a glass lid, and then the lid is connected to a base part, in particular a wafer, so as to form a hermetically sealed housing. In this case, at least one mounting area for an electronic device is provided under the glass window, or under a portion of the glass lid, and another mounting area for an electronic device is provided under a portion of the lid not provided with a glass window, or under the window made of infrared radiation transparent material. Thus, according to a first embodiment, the lid material itself defines an infrared radiation-transparent window over the other mounting area, and the lid material is preferably directly connected to the base part.

It is in particular contemplated to use a substrate for the lid into which at least one opening is introduced for integrating the glass window or the window made of infrared radiation transparent material.

The opening may be introduced, for example, by etching, in particular wet etching or reactive ion etching, or by mechanical processing, such as drilling, grinding, lapping, or sandblasting.

Depending on the employed process, the resulting side walls of the opening may be oblique.

The oblique opening may even improve the mechanical connection of the components, especially when a glass window is integrated by fusing.

Subsequent to the opening being introduced, the at least one glass window or window of infrared radiation transparent material is integrated.

For this purpose, various embodiments are suggested.

First, the glass can be directly integrated by fusing.

To fuse, a glass insert is used which is introduced into the previously provided opening of the substrate.

Then, the substrate together with the glass insert is heated to a temperature above $T_g$ of the glass, thereby causing the glass to bond to the substrate and to form a window.

Due to the surface tension of the glass, a lens may be formed thereby, in particular a convex lens, as is contemplated according to one embodiment of the invention.

This embodiment has the advantage that it allows to provide a very stable mechanical and hermetically sealed connection in a simple way.

The selection of the employed glasses is limited in this embodiment of the invention, depending on the geometry of the housing, due to, first, the employed glasses should have a coefficient of expansion that is adapted to the thermal expansion coefficient of the substrate, and, secondly, the employed glasses must have a sufficiently low glass transition temperature.

According to another embodiment of the invention, a solder is used which softens or melts at a lower temperature than the glass window.

It may be advantageous to use solder as this permits greater freedom to choose the material to be used for the glass window. In particular, it is possible to integrate into the lid, as a window, a pre-shaped optical elements, e.g. lenses, filters, diffractive optical elements, etc., and the shape thereof is not defined by the fusing when being connected, wherein the pre-shaped optical elements are preferably integrated by soldering, bonding, or welding.

Furthermore, low-melting solders can be used, in particular solders with a glass transition temperature of less than 350° C.

According to one embodiment of the invention, a glass solder is used. Wherein the glass solder has a lower glass transition temperature than the material of the window.

According to another embodiment of the invention, a window is metallized, preferably at least in portions thereof, in particular by a deposition method. Which is then inserted into the opening of the substrate and connected to the substrate by melting of a metal solder.

The aforementioned embodiments have in common that the glass windows are preferably at least partially arranged within the opening of the substrate, i.e. connected to the lateral walls of the opening.

Connecting to the lateral walls of the opening allows a particularly flat design.

In a further embodiment of the invention, the at least one glass window or window of infrared radiation transparent material is bonded, in particular anodically bonded, or welded, preferably, a structured glass wafer is used for this purpose, wherein it may be welded to the lid substrate using laser radiation, for example.

For this purpose, the glass, in particular the glass window, in particular the structured glass wafer, is preferably placed on the substrate such that the openings of the substrate are covered by glass.

A connection is achieved by welding or anodic bonding, so that an underside of the glass, in particular of the glass window, is joined to an upper surface of the substrate, thus, in these embodiments of the invention, the connection is preferably not achieved on the lateral walls of the openings, but at the upper surface of the lid.

In the embodiment which uses a glass lid which is provided with an infrared radiation transparent window, the glass lid is connected to the base part and/or to the infrared radiation transparent window preferably by anionic bonding.

Preferably, a lid made of a borosilicate glass is used for this purpose. Since the latter has an expansion coefficient that is adapted to the coefficient of linear thermal expansion of the base part and of the infrared radiation transparent window, it is possible to provide such a housing in a simple way. In particular, the coefficient of linear thermal expansion of the borosilicate glass differs from the coefficient of linear thermal expansion of the material of the base part and/or of the infrared radiation transparent window by not more than +/−0.5 ppm/K.

BRIEF DESCRIPTION OF THE DRAWINGS

The above-mentioned and other features and advantages of this invention, and the manner of attaining them, will become more apparent and the invention will be better understood by reference to the following description of (an) embodiment(s) of the invention taken in conjunction with the accompanying drawing(s), wherein.

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 1A:
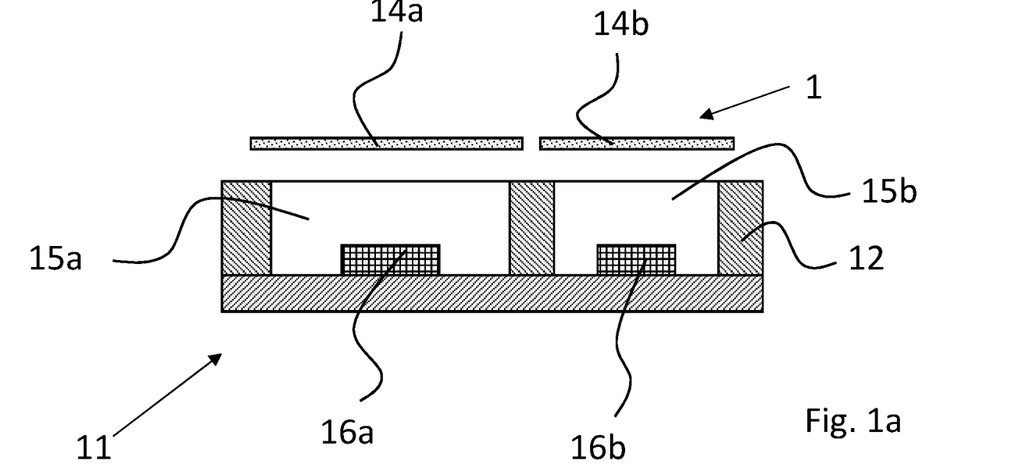
FIGS. 1a and 1b are schematic sectional views intended to explain the configuration of a generic housing for optoelectronic devices as it is known from prior art.
Figure 1B:
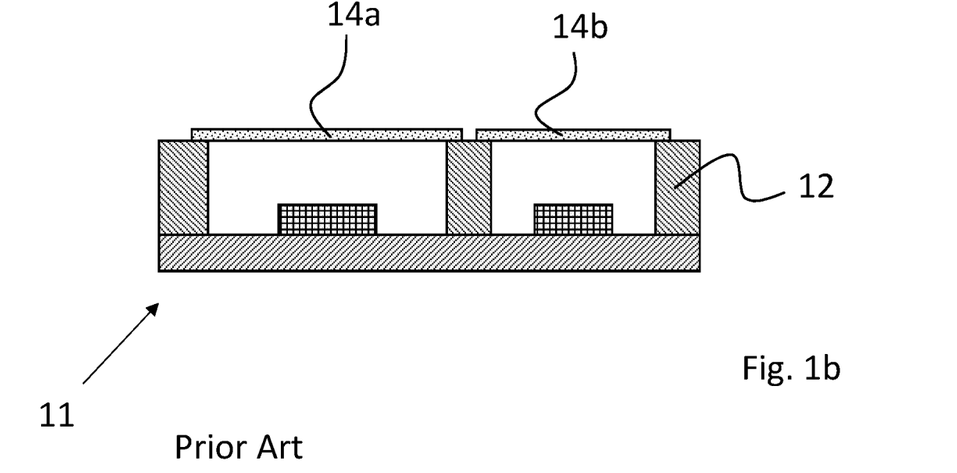

FIGS. 1a and 1b show, by way of a sectional view, how a housing 11 for optoelectronic devices 16a, 16b is produced according to the prior art.

As illustrated in the sectional view of FIG. 1a, housing 11 consists of a lower part 12, onto which at least one lid 1 is applied.

The lower part 12 has recesses, each one defining a mounting area 15a, 15b for an optoelectronic device 16a, 16b.

In order to close the mounting areas 15a, 15b with a hermetically sealed lid 1, two windows 14a, 14b are applied directly onto the lower part 12 which forms a frame for the windows 14a and 14b. Thus, the lid 1 is formed by windows 14a and 14b.

As shown in FIG. 1b, windows 14a, 14b are connected to the lower part 12 by attaching them to the lower part 12 in hermetically sealing manner by means of a solder, for example.

Window 14a may, for example, be transparent to infrared radiation so that, accordingly, the optoelectronic device 16a is for instance an infrared sensor. Window 14b, by contrast, may be transparent to ultra violet ("UV") radiation or visible light, for example, so that the optoelectronic device 16b is for instance implemented as an light-emitting diode ("LED") or a photocell.

The attachment of the windows 14a and 14b is complicated because they have to be applied, as individual windows, on a frame which is provided as part of the lower part 12 of the housing 11 in this embodiment.

The invention therefore proposes to provide a single lid in which the material of the lid itself provides the window that is transparent to infrared radiation, and the lid has a glass window which is transparent in another wavelength range.

FIGS. 2a to 2d show the method steps for integrating the glass windows into such a lid 1 according to the first embodiment of the invention.

Figures 2A, 2B, 2C:
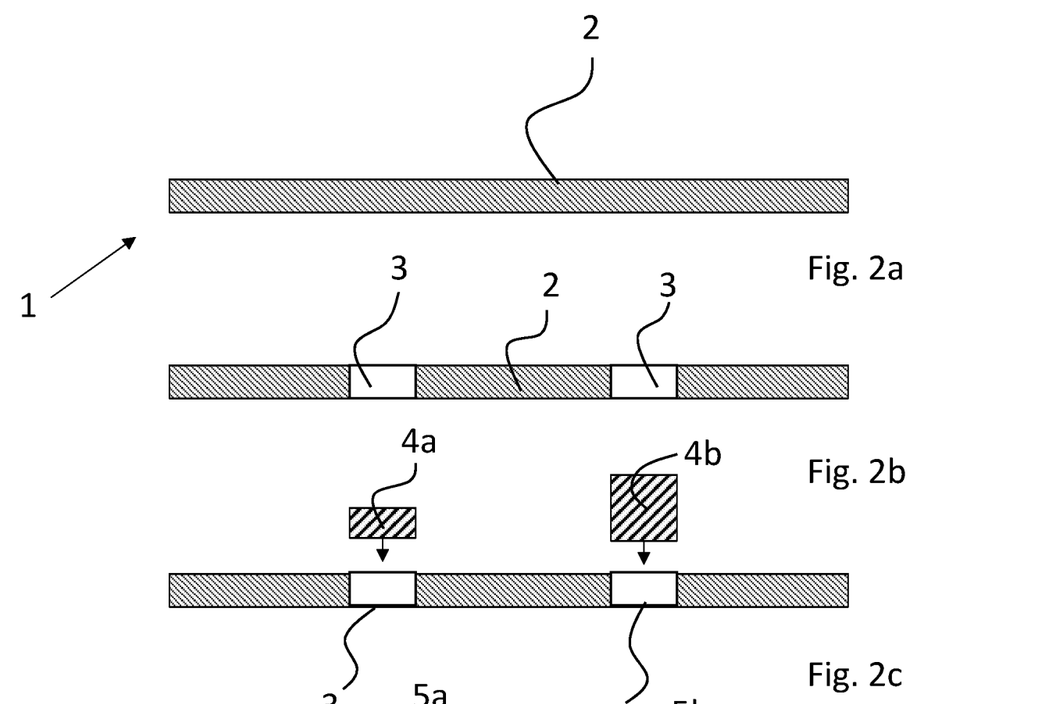
FIGS. 2a to 2d are intended to illustrate an exemplary embodiment of a method according to the invention in which the glass windows are integrated into the lid by fusing.

For providing a lid 1, first a substrate 2 is provided, in particular in the form of a silicon wafer, (see FIG. 2 a).

Then, as shown in FIG. 2b, openings 3 are introduced into the substrate 2, for example by etching or mechanical processing.

Then, as shown in FIG. 2c, glass inserts 4a, 4b are introduced into the openings 3.

Figure 2D:
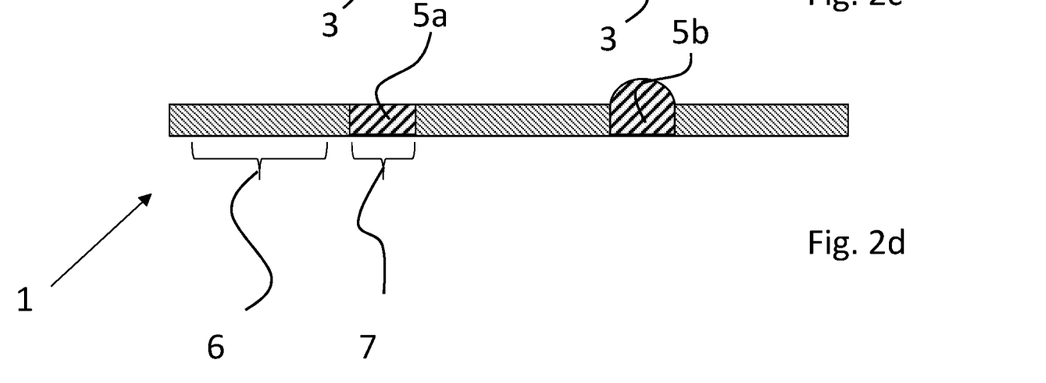

As illustrated in FIG. 2d, the lid 1 is then heated to a temperature above the glass transition temperature $T_g$.

The glass of the glass inserts 4a and 4b softens and bonds to the lateral surface of the opening 3 of the substrate 2 to form a hermetic seal. In this way, windows 5a, 5b are being formed from the fused glass inserts 4a, 4b.

Depending on the glass that is used, its volume and its surface tension, and depending on the atmosphere under which the heating is performed, a lens may form, as illustrated by window 5b.

Now, an IR-transparent window exists below an area 6 of the lid 1, which window is defined by the lid 1. In the area 7, by contrast, a window 5a is provided which is transparent to UV and/or to visible light.

Thus, mounting areas for different optoelectronic devices can be arranged below areas 6 and 7.

Figure 5A:
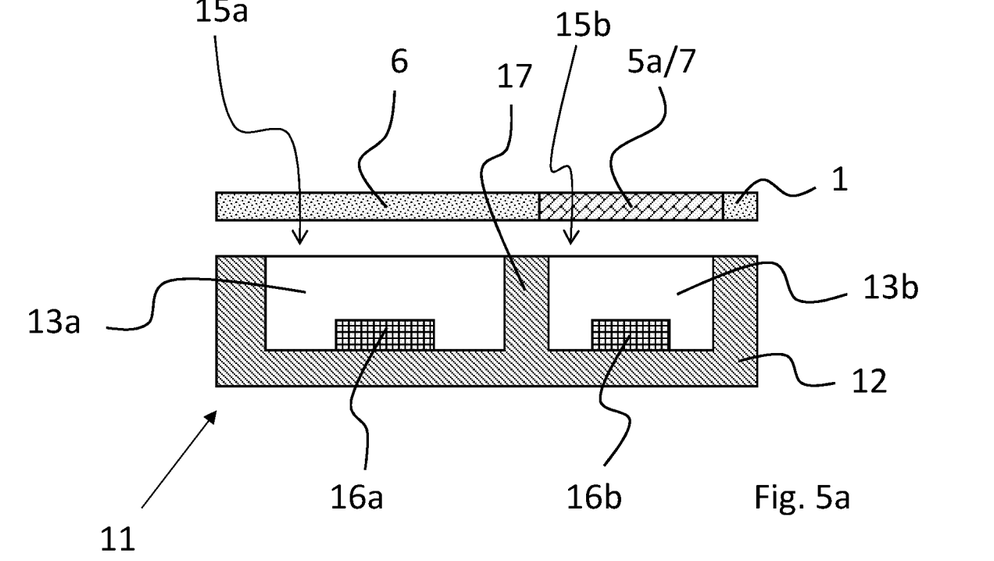
FIGS. 5a and 5b are schematic sectional views of the components of an exemplary embodiment of a housing according to the invention including optoelectronic devices.
Figure 6A:
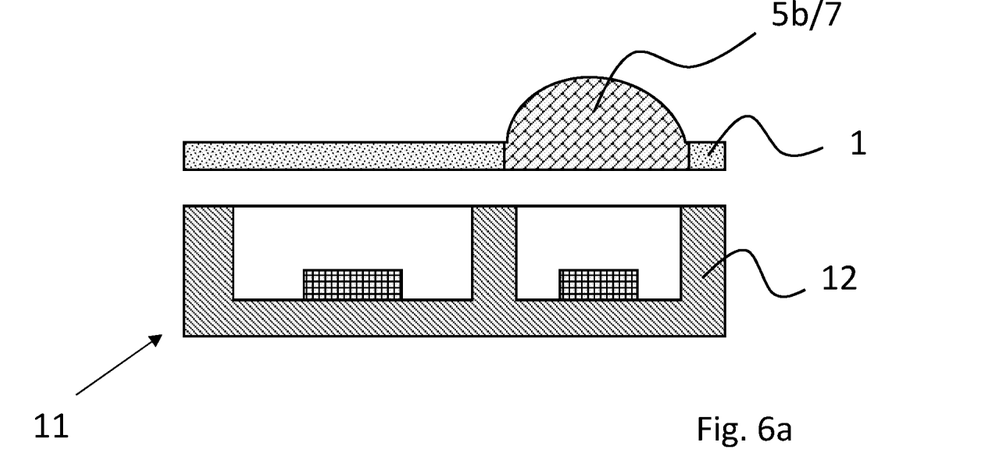
FIGS. 6a and 6b show further schematic sectional views of an alternative embodiment of a housing including optoelectronic devices.

Once the glass windows 5a, 5b have been introduced, lid 1 is preferably connected to a base part 12, as illustrated in FIGS. 5a and 6a in particular to a wafer on which the electronic devices are arranged.

Then the wafer is ready to be diced into individual dies.

According to one embodiment of the invention it is suggested that the dicing, that is to say the separating of the wafer, is effected in a portion of the lid 1.

It is in particular also suggested according to the invention that diced components are provided which do not have a glass window, but only a lid that is transparent to infrared radiation.

In the wafer assembly, the invention offers significant cost advantages also for such embodiments.

Referring to FIGS. 3a to 3d, a further embodiment of the method according to the invention will be explained.

Figure 3A:
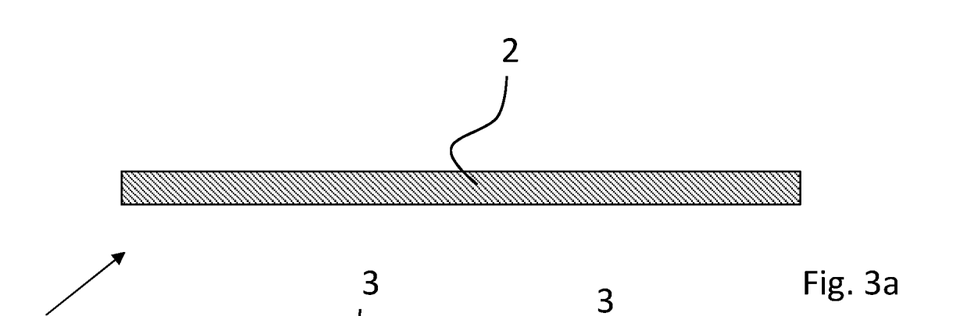
FIGS. 3a to 3d show an exemplary embodiment in which the glass windows are connected to the lid substrate by means of a solder.
Figure 3B:
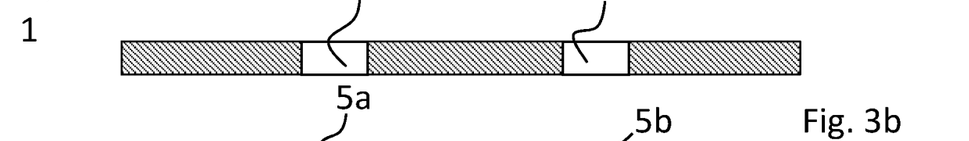

As illustrated in FIGS. 3a and 3b, first, openings 3 are introduced into the substrate 2 of the lid 1, like in the method described above with reference to FIGS. 2a to 2d.

Figure 3C:
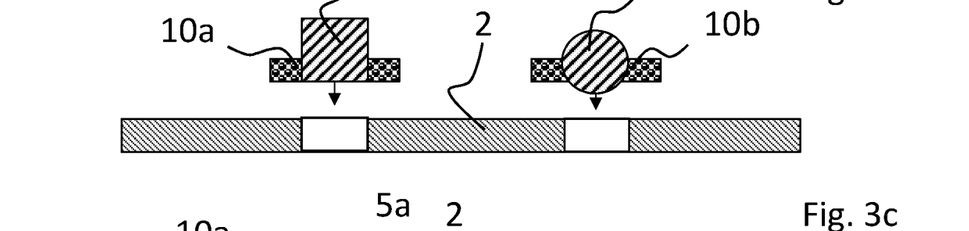

Then, as shown in FIG. 3c and in contrast to the method described with reference to FIGS. 2a to 2d, glass windows 5a, 5b are provided which are not connected to the substrate 2 by softening the glass of the glass windows 5a, 5b itself, but rather by using a solder, in particular a solder glass 10a, 10b.

Windows 5a, 5b may be plate-shaped windows, or else optical components, for example in the form of a lens, as symbolized by the round shape of glass window 5b.

Figure 3D:
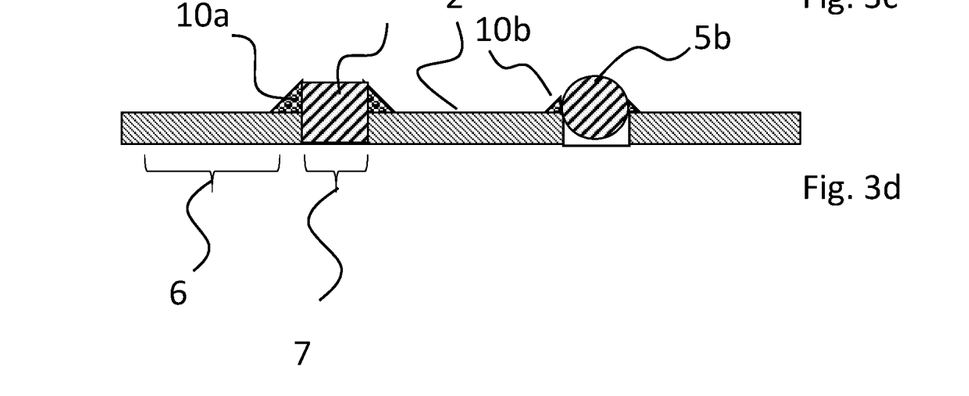

By heating the glass solder 10a, 10b, glass windows 5a, 5b are bonded to the substrate 2, and in the present embodiment, the windows 5a, 5b protrude from the substrate and the glass solder 10a, 10b is disposed around the protruding portion.

According to a further embodiment of the invention, it is likewise possible for the glass solder 10a, 10b, for example, to be introduced into the opening 3 in the form of a sleeve so as to connect the lateral surfaces of the glass windows 5a, 5a to the lateral surfaces of the opening 3 (not shown).

Figures 4A, 4B:
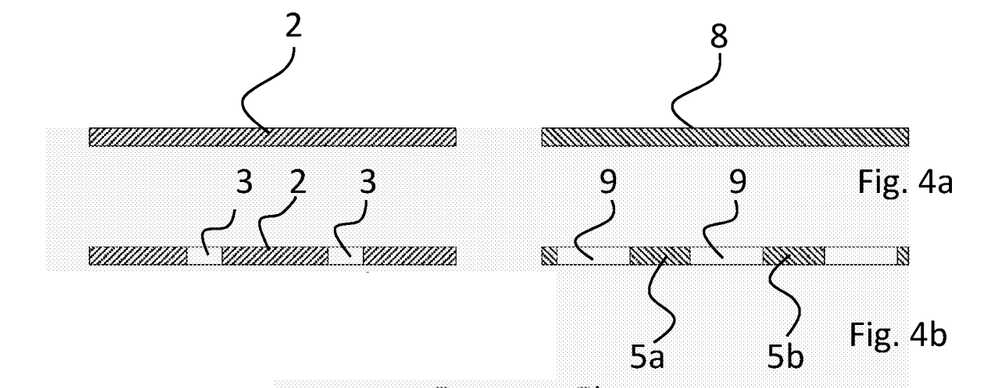
FIGS. 4a to 4d show a method in which a structured glass wafer is applied to the substrate and connected thereto by welding or anionic bonding.

FIGS. 4a to 4b schematically show a further embodiment of the invention, in which a substrate 2 is provided, in particular in the form of a silicon wafer, into which, again, openings 3 are introduced.

Furthermore, a glass substrate 8 is provided, in particular a glass wafer, which is structured as illustrated in FIG. 4b, thereby producing open areas 9 and closed areas forming the later glass windows 5a, 5b.

Figure 4C:
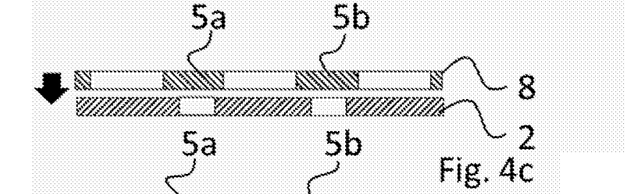

As illustrated in FIG. 4c, the glass substrate 8 is placed onto the substrate 2 of the lid 1 such that the glass windows 5a, 5b cover the openings 3.

Then, glass windows 5a, 5b are connected to the substrate 2.

This can be done by welding, in particular using laser radiation. In particular, the glass substrate 8 and the substrate 2 of the lid may be pressed together, and a focused laser may be used to heat the material of both the substrate 2 and the glass window 5 at the edges of openings 3 so that welding occurs.

Figure 4D:
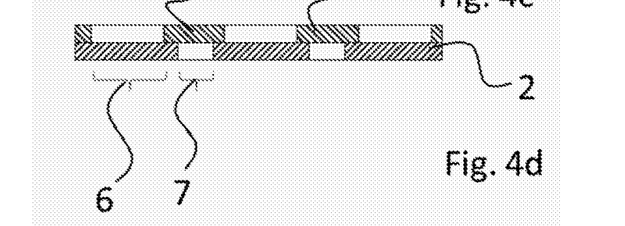

According to a further embodiment, the connecting step illustrated in FIG. 4d may be effected by anionic bonding. In this case, a voltage is applied between the two halves of a tool which clamps the assembly consisting of glass substrate 8 and substrate 2 of the lid, at a high temperature, typically above 350° C. In particular an alkali-containing glass can be used in this case. Due to charge zones because of ion migration at the interfaces, silicon oxygen bridges are being formed which result in a bond between glass substrate 8 and substrate 2.

As in the other embodiments, a portion of the substrate 2 of lid 1 itself provides an area 6 that is transparent to infrared radiation, whereas a glass window 5a defines a mounting area over which the lid 1 is transparent in another wavelength range.

Referring to the schematic sectional views of FIGS. 5a and 5b, it will be explained how a housing 11 with a lid 1 according to the invention is formed.

As shown in FIG. 5a, the housing 11 consists of a base part or lower part 12 and the lid 1 in this embodiment.

Lid 1 preferably has a plate-like shape and comprises a substrate made of a material that is transparent to infrared radiation, as described above.

Furthermore, lid 1 comprises a window 5a preferably integrated by fusing, which is transparent in another range of wavelengths.

The lower part 12 has recesses 15a, 15b in this embodiment, each of which defines a mounting area 13a, 13b for at least one optoelectronic device 16a, 16b.

The lower part 12 may comprise feedthroughs and/or circuit traces (not shown) for the optoelectronic devices 16a, 16b.

The lower part 12 may be made of silicon or ceramics, for example.

In this exemplary embodiment, the lower part 12 has at least one web 17 separating the mounting areas 13a and 13b from each other.

Web 17 also serves as a support surface for the lid 1.

Mounting areas 13a, 13b preferably have an surface area from 4 mm² to 10 cm², in plan view.

Figure 5B:
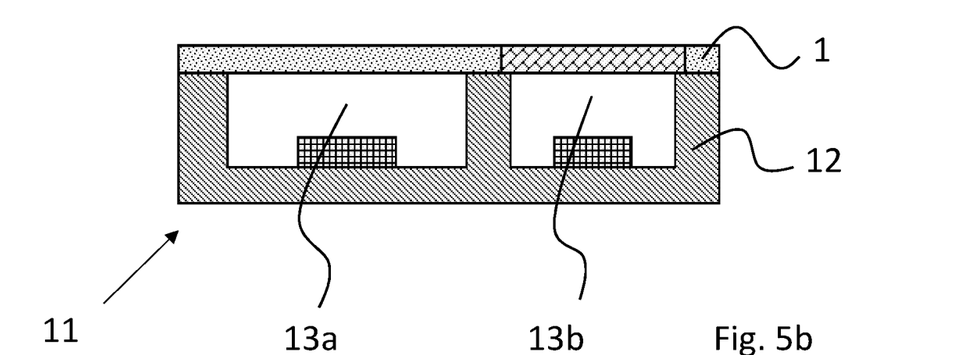

As illustrated in FIG. 5b, lid 1 is connected to the base part 12 so as to form a hermetically sealed mounting area 13a, 13b.

This can be achieved by using a glass solder or metal solder, for example.

Window 5a is preferably integrated into the substrate of lid 1 before lid 1 is connected to the lower part 12.

The material of the lid 1 itself is transparent to infrared radiation, so that the area 6 provides a window for entry or exit of infrared radiation for the optoelectronic device 16a.

Window 5a, by contrast, provides an area 7 which defines a window for UV radiation or visible light, for example. Accordingly, the optoelectronic device 16b will either receive and/or emit UV radiation and/or radiation in the visible wavelength range.

Figure 6B:
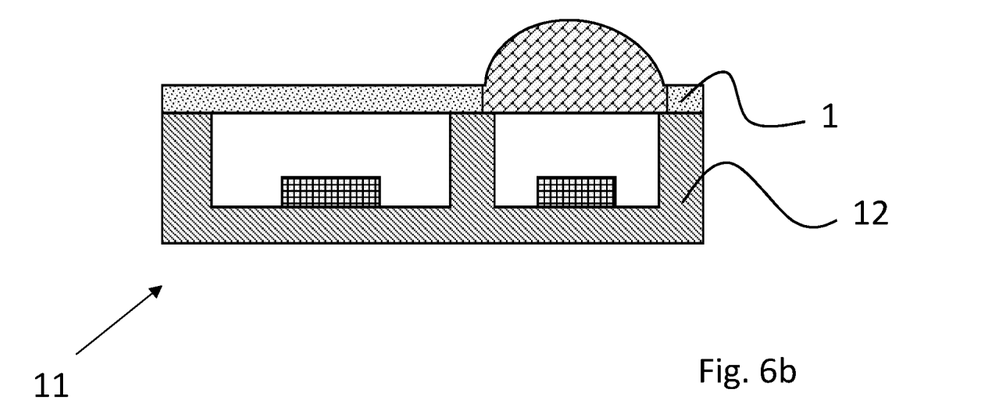

FIGS. 6a and 6b show an alternative embodiment of the invention, in which in contrast to the embodiment according to FIGS. 5a and 5b, the window 5b which provides an area 7 that is transparent to UV radiation or visible light, has the form of a lens.

Such a window 5b in the form of a lens may be provided, as already described with reference to FIGS. 2a to 2d, by integrating a glass insert by fusing, which forms a lens due to its surface tension.

Figure 7A:
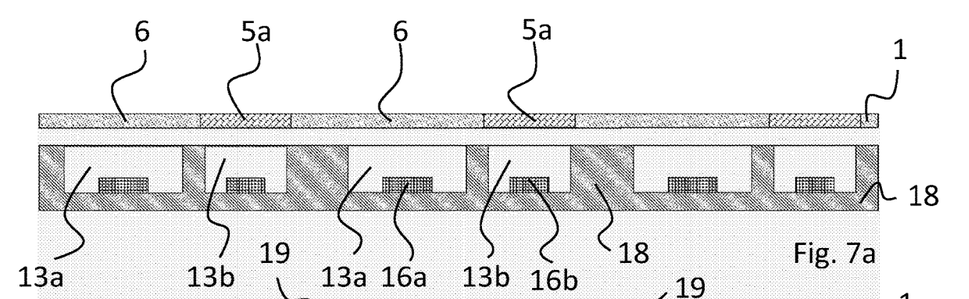
FIGS. 7a to 7c are schematic sectional views intended to illustrate how a plurality of optoelectronic devices provided in a wafer assembly are equipped with a lid and are subsequently diced.
Figures 7B, 7C:
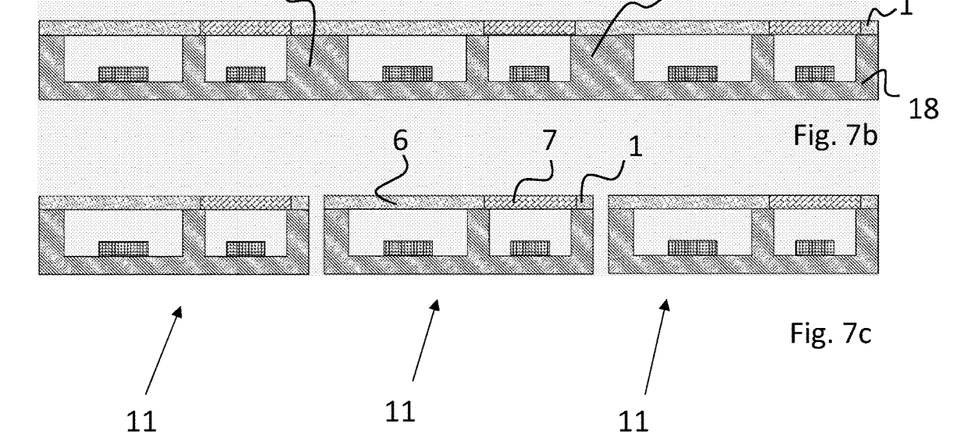

Referring to FIGS. 7a to 7c, the manufacturing of a plurality of housings 11 will be described, which is achieved in a wafer assembly according to an embodiment of the invention.

As illustrated in FIG. 7a, a wafer 18 is used for this purpose, in particular a silicon wafer or a ceramic wafer having a multiplicity of recesses each one defining a mounting area, 13a and 13b, respectively.

Prior to the application of lid 1, an optoelectronic device 16a, 16b is introduced into each of these recesses and is electrically connected, for example, via feedthroughs of the wafer 18 (not shown herein).

Lid 1 has a plurality of windows 5a which are transparent to a different range of wavelengths than the material of the lid 1 itself, as already mentioned above.

Lid 1 has a size large enough to cover the surface area of a plurality of housings 11. Preferably, a single lid 1 is used for a single wafer 18.

As illustrated in FIG. 7b, the wafer 18 which simultaneously forms the lower part of housing 11, is connected to the lid 1.

Then, the wafer 18 is diced into a plurality of housings 11 by being cut along the walls 19, as shown in FIG. 7c.

Then, in this embodiment, each housing 11 has a lid 1 which includes an area 6 that is transparent to infrared radiation, and a further area 7 that is formed by the window 5a and is transparent to a different wavelength.

Due to the fabrication in the wafer assembly, as intended according to one embodiment of the invention, it is possible to provide, in a simple manner, housings with optoelectronic devices, which include a mounting area for a UV-selective optoelectronic device and/or for an optoelectronic device selective in another wavelength range.

According to a further, second embodiment of the invention, the lid 1 consists of glass, and the window 5a/5b is made of a material that is transparent to infrared radiation. Otherwise, with the exception of the design of the windows in the form of fused lenses, the housing 11, in particular the lid 1, can be formed and/or manufactured as described above.

In this embodiment of the invention, the lid 1 preferably consists of a borosilicate glass and is connected to the base part/lower part 12 and to the window 5a/5b by anionic bonding.

The invention furthermore permits to provide, in simplified manner, a hermetically sealed housing having both an area that is transparent to infrared radiation and a glass window which transmits electromagnetic radiation in a different wavelength range.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

LIST OF REFERENCE NUMERALS

1 Lid
2 Substrate
3 Opening
4a, 4b Glass insert
5a, 5b Window
6 Window transparent to infrared radiation
7 Windows for UV radiation and/or visible light
8 Glass substrate
9 Open area
10a, 10b Solder glass
11 Housing
12 Base part/lower part
13a, 13b Mounting area
14a, 14b Windows
15a, 15b Recess
16a, 16b Optoelectronic device
17 Web
18 Wafer
19 Wall

What is claimed is:

1. A housing for at least one electronic device, the housing including a base part, wherein the base part includes a first mounting area for the at least one electronic device, the housing further including a lid made of a material that is transparent to infrared radiation, wherein the lid made of material that is transparent to infrared radiation has at least one glass window integrated therein, wherein the lid is connected to the base part so as to hermetically seal the housing, wherein the material that is transparent to infrared radiation has an average transmittance of more than 40% across an entire wavelength range between 1.5 µm to 5 µm.

2. The housing as claimed in claim 1, wherein the at least one glass window is transparent to at least one of UV radiation and visible light.

3. The housing as claimed in claim 1, wherein the lid made of an infrared radiation transparent material is made of silicon, aluminum oxide, in particular sapphire, or germanium.

4. The housing as claimed in claim 1, wherein the at least one glass window is made of a glass having a coefficient of mean linear thermal expansion (α) at 20 to 300° C. of 2 to 5 ppm/K.

5. The housing as claimed in claim 1, wherein the at least one glass window, at 20° C., is under a stress ranging between −100 MPa of compressive stress and +30 MPa of tensile stress.

6. The housing as claimed in claim 1, wherein the at least one glass window is made of a glass having a coefficient of mean linear thermal expansion (α) at 20 to 300° C. of 3 to 5 ppm/K and a glass transition temperature (Tg) between 300 and 600° C.

7. The housing as claimed in claim 1, wherein the at least one glass window has been integrated into the lid by fusing.

8. The housing as claimed in claim 1, wherein the first mounting area is arranged under a portion of the lid made of material that is transparent to infrared radiation and the housing further includes a second mounting area arranged under the at least one glass window.

9. The housing as claimed in claim 1, wherein the at least one glass window is made of borosilicate glass.

10. A housing for at least one electronic device, the housing including a base part, wherein the base part includes a mounting area for the at least one electronic device, the housing further including a lid made of a material that is transparent to infrared radiation, wherein the lid made of material that is transparent to infrared radiation has at least one glass window integrated therein, wherein the lid is connected to the base part so as to hermetically seal the housing, wherein the lid is made of an infrared radiation transparent material selected from a group consisting of silicon, aluminum oxide, sapphire, germanium, and mixtures thereof, wherein the at least one glass window is transparent to at least one of UV radiation or visible light.

11. A housing for at least one electronic device, the housing including a base part, wherein the base part includes a mounting area for the at least one electronic device, the housing further including a lid, wherein the lid has a plurality of windows integrated therein that are made of a material transparent to a first range of wavelengths of light and the lid is transparent to a second range of wavelengths of light that differs from the first range of wavelengths of light, wherein the lid is connected to the base part so as to hermetically seal the housing, wherein the lid is made of an infrared radiation transparent material selected from a group consisting of silicon, aluminum oxide, sapphire, germanium, and mixtures thereof.

* * * * *

UNITED STATES PATENT AND TRADEMARK OFFICE
CERTIFICATE OF CORRECTION

| | |
|---|---|
| PATENT NO. | : 11,515,221 B2 |
| APPLICATION NO. | : 16/001323 |
| DATED | : November 29, 2022 |
| INVENTOR(S) | : Robert Hettler |

It is certified that error appears in the above-identified patent and that said Letters Patent is hereby corrected as shown below:

In the Specification

Column 2
At Line 5, please delete "1 m", and substitute therefore --1 µm--.

Column 4
At Line 7, please delete "expansion a", and substitute therefore --expansion α--;
At Line 11, delete "expansion a", and substitute therefore --expansion α--; and
At Line 17, delete "expansion a", and substitute therefore --expansion α--.

Signed and Sealed this
Twenty-third Day of July, 2024

*Katherine Kelly Vidal*

Katherine Kelly Vidal
*Director of the United States Patent and Trademark Office*